United States Patent
Duva et al.

(10) Patent No.: US 11,132,033 B2
(45) Date of Patent: Sep. 28, 2021

(54) MODULAR CONTROLLERS

(71) Applicant: Hamilton Sundstrand Corporation, Charlotte, NC (US)

(72) Inventors: Conner Duva, Enfield, CT (US); Chi Wan, South Windsor, CT (US); Kevin Cremona, Westfield, MA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/249,564

(22) Filed: Jan. 16, 2019

(65) Prior Publication Data

US 2020/0225717 A1 Jul. 16, 2020

(51) Int. Cl.
| | |
|---|---|
| *G06F 1/18* | (2006.01) |
| *G06F 13/40* | (2006.01) |
| *H05K 5/00* | (2006.01) |
| *H05K 7/14* | (2006.01) |
| *H05K 9/00* | (2006.01) |

(52) U.S. Cl.
CPC .......... *G06F 1/182* (2013.01); *G06F 13/4027* (2013.01); *H05K 5/0026* (2013.01); *H05K 7/1459* (2013.01); *H05K 9/0022* (2013.01)

(58) Field of Classification Search
CPC ... G06F 13/4027; G06F 1/182; H05K 7/1459; H05K 5/0026; H05K 9/0022
See application file for complete search history.

(56) References Cited

U.S. PATENT DOCUMENTS

| | | | | |
|---|---|---|---|---|
| 4,790,760 | A | | 12/1988 | Kreinberg |
| 5,802,328 | A | * | 9/1998 | Yoshimura .......... G06F 13/4081 710/301 |
| 6,098,140 | A | * | 8/2000 | Pecone ................ G06F 9/4411 710/301 |
| 6,529,967 | B1 | * | 3/2003 | Robertson ............... G06F 1/189 439/55 |
| 7,014,472 | B2 | * | 3/2006 | Fjelstad ................. H05K 1/147 439/637 |
| 7,075,796 | B1 | * | 7/2006 | Pritchett ................. G06F 1/184 211/41.17 |
| 7,324,835 | B2 | | 1/2008 | Chen et al. |
| 8,363,412 | B2 | * | 1/2013 | Budai ..................... G06F 1/185 361/720 |
| 8,396,603 | B2 | * | 3/2013 | Savelle, Jr. ............ A01G 25/16 700/284 |
| 9,068,880 | B2 | | 6/2015 | Acharya et al. |

(Continued)

OTHER PUBLICATIONS

Extended European Search Report; Application No. 19208356.6; dated May 26, 2020; 8 pages.

*Primary Examiner* — Rockshana D Chowdhury
*Assistant Examiner* — Douglas R Burtner
(74) *Attorney, Agent, or Firm* — Cantor Colburn LLP

(57) ABSTRACT

A modular controller includes an enclosure having an interior, a motherboard with a signal trace and a power trace supported within the interior of the enclosure, and one or more control section. The control section includes one or more of an input power section, an electromagnetic interference section, a logic section, a control section, a output power section, and a signal section that is supported by the motherboard to selectively flow of electrical power through the power trace using a control signal carried by the signal trace. Electrical systems and methods of making modular controllers are also described.

9 Claims, 4 Drawing Sheets

(56) References Cited

U.S. PATENT DOCUMENTS

| | | | |
|---|---|---|---|
| 10,499,525 B1* | 12/2019 | Singh | H05K 7/1492 |
| 10,614,005 B1* | 4/2020 | Villano | G05B 19/042 |
| 2003/0152145 A1* | 8/2003 | Kawakita | H04N 7/083 |
| | | | 375/240.12 |
| 2005/0202847 A1 | 9/2005 | Yu et al. | |
| 2012/0307421 A1* | 12/2012 | Ewing | H05K 5/0026 |
| | | | 361/622 |
| 2016/0149380 A1* | 5/2016 | Dickey | H05K 7/1457 |
| | | | 361/631 |
| 2016/0229361 A1 | 8/2016 | Osternack et al. | |
| 2017/0181310 A1 | 6/2017 | Deshayes | |
| 2018/0358785 A1* | 12/2018 | Roberts | H05K 7/1412 |
| 2020/0091832 A1* | 3/2020 | Pal | H01L 25/18 |

\* cited by examiner

MODULAR CONTROLLERS

STATEMENT OF FEDERAL SUPPORT

This invention was made with Government support under Contract NNH15CN27C awarded by National Aeronautics and Space Administration (NASA). The Government has certain rights in the invention.

BACKGROUND

The subject matter disclosed herein electrical systems, and more particularly to controllers for electrical devices in electrical systems.

Electrical systems, such as aircraft electrical systems, commonly employ controllers to control the flow of power to various electrical devices connected to the electrical system. The controllers generally include circuitry that is peculiar to the needs of the controlled device and implemented using application-specific traces defined in printed wiring boards and/or printed circuit boards. The application-specific-circuitry provides control over power communicated to electrical device from the electrical system and through the controller. Because the circuitry is application-specific, the printed wiring boards and/or printed circuit boards employed in such controllers typically require retracing, rerouting and/or requalification when the controller is upgraded or adapted to provide power to an electrical device having different requirements.

BRIEF SUMMARY

According to one embodiment a modular controller is provided. The modular controller includes an enclosure with an interior, a motherboard with a signal trace and a power trace supported within the interior of the enclosure, and one or more device section. The device section is selected from a group including (a) a input power section, (b) an electromagnetic interference (EMI) section, (c) a logic section, (d) a control section, (e) a output power section, and (0 a signal section and is supported by the motherboard to selectively flow electrical power through the power trace using a control signal carried by the signal trace.

In addition to one or more of the features described above, or as an alternative, further embodiments may include wherein the input power section comprises an input power connector seated in the enclosure, a pin seat supported by the motherboard and connected to the signal trace and the power trace, and a power cable connecting the input power connector to pins of the pin seat.

In addition to one or more of the features described above, or as an alternative, further embodiments may include wherein the output power section comprises an output power connector seated in the enclosure, a pin seat supported by the motherboard and connected to the signal trace and the power trace, and a power cable connecting the output power connector to pins of the pin seat.

In addition to one or more of the features described above, or as an alternative, further embodiments may include wherein the signal section comprises a signal connector seated in the enclosure, a pin seat supported by the motherboard and connected to the signal trace and the power trace, and a signal cable connecting the signal connector to pins of the pin seat.

In addition to one or more of the features described above, or as an alternative, further embodiments may include wherein the EMI section comprises EMI circuitry including one or more of (a) an EMI protection circuit element, (b) a filter, and (c) a transformer; a pin seat supported by the motherboard and connected to the signal trace and the power trace; and a daughterboard seated in the pin seat and supporting the EMI circuitry, wherein the EMI circuitry is connected to the power trace by pins of the pin seat.

In addition to one or more of the features described above, or as an alternative, further embodiments may include an EMI gasket separating the daughterboard from the enclosure.

In addition to one or more of the features described above, or as an alternative, further embodiments may include wherein the motherboard comprises a chassis ground strap, the chassis ground strap electrically connected to the daughterboard.

In addition to one or more of the features described above, or as an alternative, further embodiments may include wherein the logic section comprises logic circuitry comprising one or more of (a) a field programmable gate array device, (b) a processor device, and (c) an application-specific integrated circuit device; a pin seat supported by the motherboard and connected to the signal trace and the power trace; and a daughterboard seated in the pin seat and supporting the logic circuitry, wherein the logic circuitry is connected to the signal trace by pins of the pin seat.

In addition to one or more of the features described above, or as an alternative, further embodiments may include, wherein the control section comprises power switching circuitry comprising a solid-state switch device and a pulse width modular operatively connected to the solid-state switch device, a pin seat supported by the motherboard and connected to the signal trace and the power trace; and a daughterboard seated in the pin seat and supporting the power switching circuitry, wherein the power switching circuitry is connected to the signal trace by pins of the pin seat, wherein the power switching circuitry is connected to the power trace by pins of the pin seat.

In addition to one or more of the features described above, or as an alternative, further embodiments may include wherein the motherboard is generic.

In addition to one or more of the features described above, or as an alternative, further embodiments may include wherein the device section is peculiar to an electrical device operatively associated with the modular controller.

In addition to one or more of the features described above, or as an alternative, further embodiments may include a plurality of card locks arranged with the interior of the enclosure for fixation of a daughterboard seated on the motherboard.

In addition to one or more of the features described above, or as an alternative, further embodiments may include a plurality of pin seats supported by the motherboard, each pin seat in electrical communication with the power trace and the signal trace, each pin seat arranged to receive a daughterboard.

In addition to one or more of the features described above, or as an alternative, further embodiments may include wherein each pin seat has a common number of pins.

According to another embodiment an electrical system is provided. The aircraft electrical system includes a modular controller as described above, a power source connected to a motor device by the modular controller. The motherboard is generic and the device section of the controller is peculiar to the motor device and is operatively associated with the motor device.

In addition to one or more of the features described above, or as an alternative, further embodiments may include wherein the one or more device section comprises an input power section, a output power section, a signal section, an EMI section, a control section, and a logic section.

In addition to one or more of the features described above, or as an alternative, further embodiments may include, an aircraft has an electrical system with a modular controller as described above.

According to a further embodiment, a method of making or configuring a modular controller is provided. The method includes supporting a motherboard with a signal trace and a power trace within an interior of an enclosure; supporting a device section selected from a group including (a) a input power section, (b) an EMI section, (c) a logic section, (d) a control section, (e) a output power section, and (f) a signal section on the motherboard; and arranging the device section to selectively flow of electrical power through the power trace using a control signal carried by the signal trace.

In addition to one or more of the features described above, or as an alternative, further embodiments may include identifying an electrical device to be controlled by the modular controller, wherein supporting the motherboard comprises selecting a motherboard that is generic to the electrical device to be controlled by the modular controller, and wherein supporting the device section comprises selecting a device section that is peculiar to the electrical device to be controlled by the modular controller.

In addition to one or more of the features described above, or as an alternative, further embodiments may include wherein supporting the device section comprises selecting one or more of (a) a input power section, (b) an EMI section, (c) a logic section, (d) a control section, (e) a output power section, and (f) a signal section that is peculiar to the electrical device to be controlled by the modular controller.

Technical effects of embodiments of the present disclosure include allowing the motherboard of the modular controller to be generic to controllers controlling electrical devices with different power and control requirements. In certain embodiments modular controllers are provided having the device-specific portion(s) of the controller abstracted from the controller motherboard, allowing the motherboard and/or the controller enclosure to be generic to a plurality of controllers.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION

The following descriptions should not be considered limiting in any way. With reference to the accompanying drawings, like elements are numbered alike:

DETAILED DESCRIPTION

Figure 1:
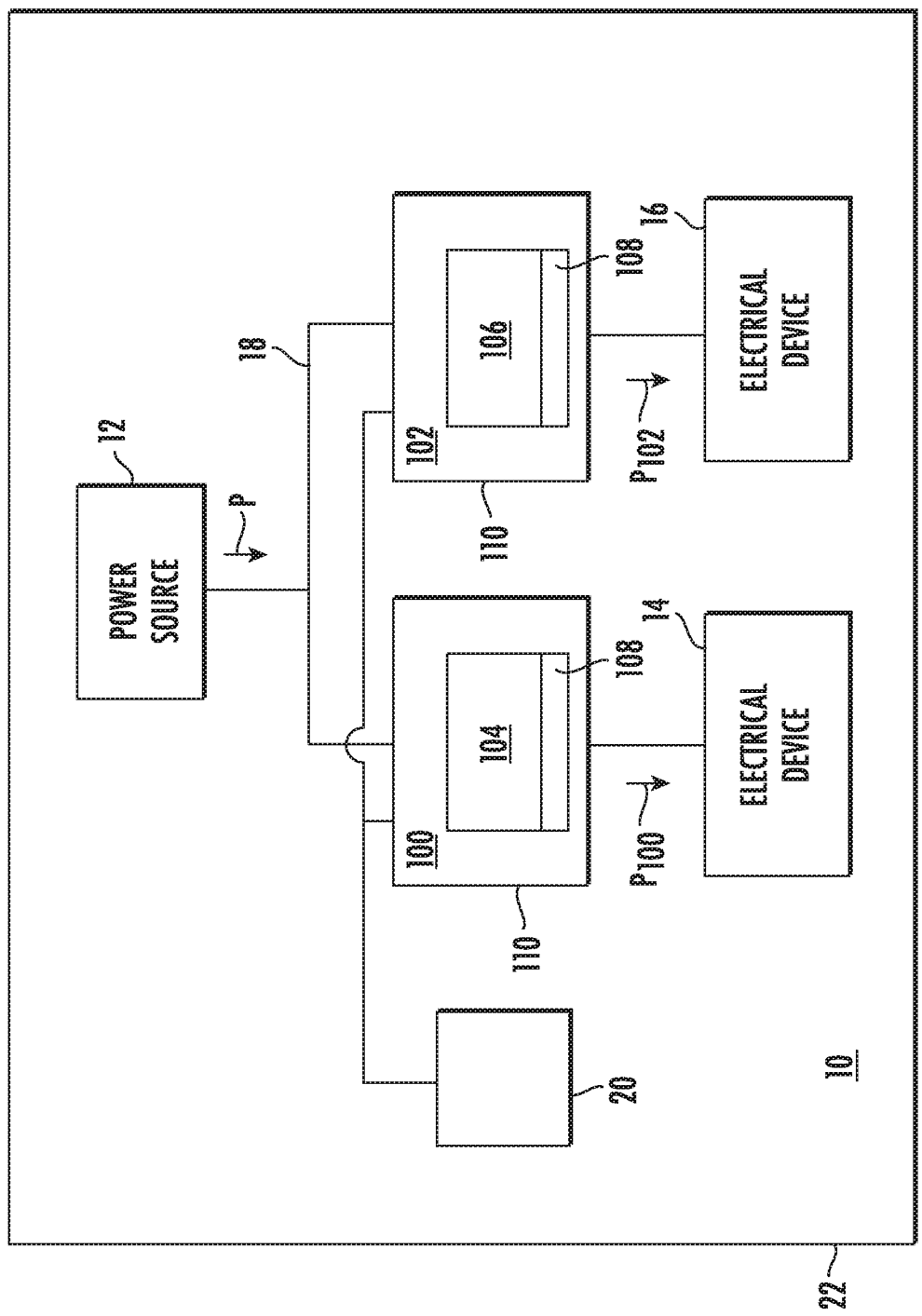
FIG. 1 illustrates a general schematic system diagram of an electrical system constructed in accordance with the present disclosure, showing a modular controller.

Reference will now be made to the drawings wherein like reference numerals identify similar structural features or aspects of the subject disclosure. For purposes of explanation and illustration, and not limitation, a partial view of an exemplary embodiment of a modular controller in accordance with the disclosure is shown in FIG. 1 and is designated generally by reference character 100. Other embodiments of modular controllers, electrical systems employing such modular controllers, and methods of making modular controllers in accordance with the present disclosure, or aspects thereof, are provided in FIGS. 2-4, as will be described. The systems and methods described herein can be used for controlling electrical devices in electrical systems, such as motors in aircraft electrical systems, though the present disclosure is not limited to any particular type of controlled device or to aircraft electrical systems in general.

Referring to FIG. 1, an electrical system 10, e.g., an aircraft electrical system, is shown. The electrical system 10 includes a power source 12, a first electrical device 14, and a second electrical device 16. The electrical system 10 also includes a power bus 18, the modular controller 100, which is a first modular controller, and one or more second modular controller 102. The power source 12 includes an electrical generator and is operably associated with an engine, such as an aircraft main engine or auxiliary power unit, solar panels, batteries and/or a ground source. The power bus 18 electrically connects the power source 12 to the first electrical device 14 and the second electrical device 16 to provide a flow of electrical power P to the first electrical device 14 and the second electrical device 16. In certain embodiments either or both the first modular controller 100 and the second modular controller 102 are motor controllers. In accordance with certain embodiments either (or both) the first electrical device 14 and the second electrical device 16 are motor devices and/or sensors.

Connectivity of the power source 12 to the first electrical device 14 is accomplished through the modular controller 100, which arranged to control the power of electrical power $P_{100}$ thereto via input from a system controller 20. Connectivity of the power source 12 to the second electrical device is accomplished through the second modular controller 102, which is also arranged to control the flow of electrical power $P_{102}$ thereto via input from the controller 20. In the illustrated embodiment and as described herein the electrical system 10 is carried by an aircraft 22. This is for illustration purposes only and is non-limiting. As will be appreciated by those of skill in the art in view of the present disclosure, the present disclosure can benefit other types of electrical systems and is not limited to aircraft electrical systems. Although a specific arrangement of the electrical system 10 is shown in FIG. 1, those of skill in the art will also appreciate that electrical systems having other arrangements are within the scope of the present disclosure.

It is contemplated that the first electrical device 14 and the second electrical device 16 have different power requirements. To accommodate the different power requirements of the first electrical device 14 and the second electrical device 16 the modular controller 100 and the second modular controller 102 are arranged to provide power peculiar to each of the electrical device connected to the respective controller. In this respect the modular controller 100 includes a device section 104 peculiar to the first electrical device 14 arranged to provide electrical power $P_{100}$ thereto and the second modular controller 102 has a device section 106 peculiar to the second electrical device 16 arranged to provide electrical power $P_{102}$ thereto, $P_{102}$ being different than $P_{100}$ notwithstanding routing through motherboards having a common arrangement.

To simplify the arrangement of the modular controller 100 and the second modular controller 102, both the first modular controller 100 and the second modular controller 102 include a generic motherboard 108. In certain embodiments the generic motherboard 108 is a singular motherboard of unitary design shared by the modular controllers, the first modular controller 100 and the second modular controller 102 each having one and not more than the one generic motherboard 108. In accordance with certain embodiments, the first modular controller 100 and the second modular controller 102 include a generic enclosure 110. As will be appreciated by those of skill in the art in view of the present disclosure, employment of the generic motherboard 108 and/or the generic enclosure 110 abstracts the circuitry and circuit elements from the motherboard, limiting the amount of retracing and associated design work required when adapting a controller design to the requirements of a new electrical device.

Figure 2:
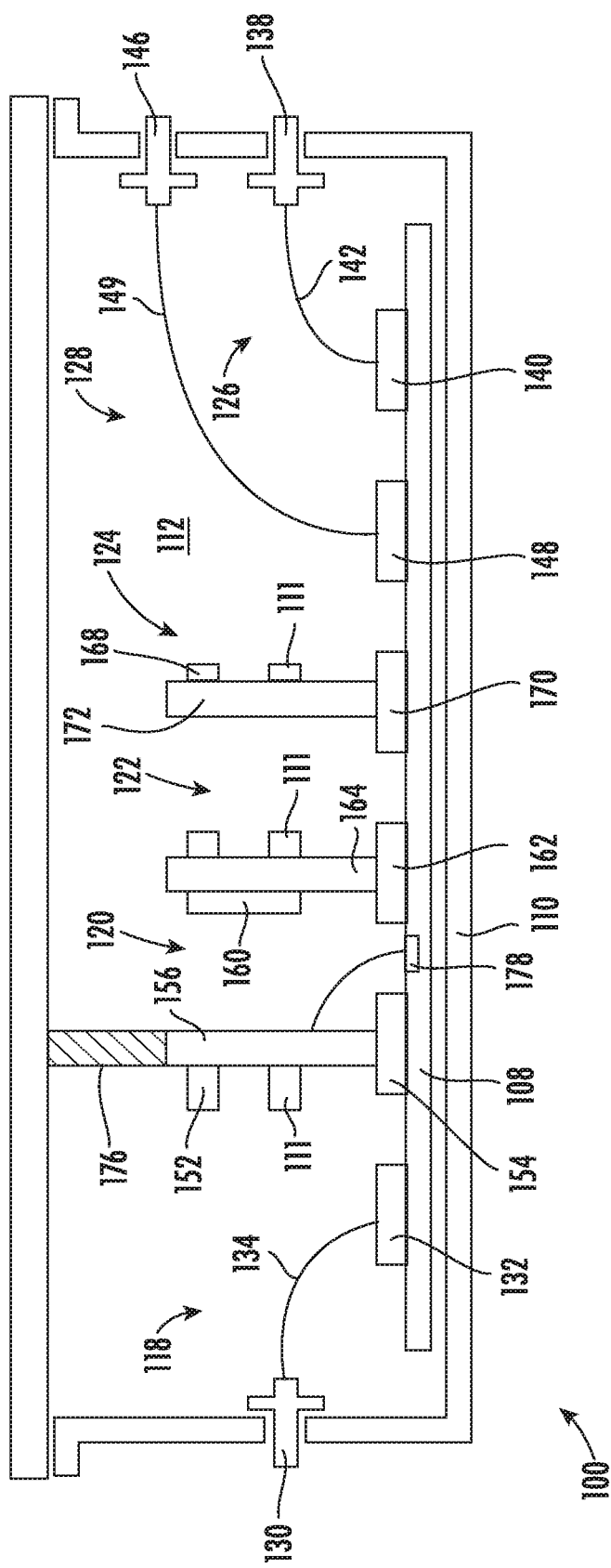
FIG. 2 is cross-sectional view of the modular controller of FIG. 1, showing a motherboard having pin seats and a device section arranged within an interior of enclosure of the modular controller.

With reference to FIG. 2, the modular controller 100 is shown. The modular controller 100 includes the generic motherboard 108, and the enclosure 110. The enclosure 110 has an interior 112. The generic motherboard 108 is supported within the interior 112 of the enclosure 110 and has a signal trace 114 (shown in FIG. 3) and a power trace 116 (shown in FIG. 3). It is contemplated that the device section 106 (shown in FIG. 1) include one or more of a input power section 118, an electromagnetic interference (EMI) section 120, a logic section 122, a control section 124, a output power section 126, and a signal section 128 seated in the generic motherboard 108 to selectively flow electrical power $P_{100}$ (shown in FIG. 1) through the power trace 116 using a control signal, e.g., control signal $S_{100}$ (shown in FIG. 3), carried by the signal trace 114. It is also contemplated that one or more card locks 111 be arranged with the interior of the enclosure 100 to provide fixation of daughterboards seated on the generic motherboard 108 within the enclosure 110.

It is contemplated that the modular controller 100 include a first pin seat, e.g., an input power pin seat 132, a second pin seat, e.g., a output power pin seat 140, and at least a third pin seat, e.g., one or more of a signal pin seat 148, an EMI pin seat 154, a pin seat switching pin seat 162, and a control pin seat 170. The pin seats are in turn each supported by the generic motherboard 108 and provide connectivity to a signal trace 114 (shown in FIG. 3) and a power trace 116 (shown in FIG. 3). In the embodiment illustrated in FIG. 2 the modular controller 100 includes each of the input power section 118, the EMI section 120, the logic section 122, a control section 124, a output power section 126, and a signal section 128. While the modular controller 100 is illustrated in FIG. 2 as having six (6) sections with a corresponding pin seat, it is to be understood and appreciated that embodiments of power controller can have fewer than six (6) sections or more than six (6) sections and corresponding pin seats, as suitable for an intended application.

The input power section 118 includes an input power connector 130, a first pin seat 132, and a power cable 134. The input power connector 130 is seated in the enclosure 110. The pin seat 132 is pin seat 132 supported by the generic motherboard 108 and is connected to the signal trace 114 (shown in FIG. 3) and the power trace 116 (shown in FIG. 3). The power cable 134 connects the input power connector 130 to pins 136 (shown in FIG. 3) of the first pin seat 132.

The output power section 126 includes an output power connector 138, a pin seat 140, and a power cable 142. The output power connector 138 is seated in the enclosure 110. The second pin seat 140 is supported by the generic motherboard 108 and is connected to the signal trace 114 (shown in FIG. 3) and the power trace 116 (shown in FIG. 3). The power cable 142 connects the output power connector 138 to pins 144 (shown in FIG. 3) of the pin seat 140.

The signal section 128 includes a signal connector 146, a pin seat 148, and a signal cable 149. The signal connector 146 is seated in the enclosure 110. The pin seat 148 is supported by the generic motherboard 108 and is connected to the signal trace 114 (shown in FIG. 3) and the power trace 116 (shown in FIG. 3). The signal cable 149 connects the signal connector 146 to pins 150 (shown in FIG. 3) of the pin seat 148.

The EMI section 120 includes EMI circuitry 152, the pin seat 154 supported by the generic motherboard 108 and connected to the signal trace 114 and the power trace 116, and a daughterboard 156 seated in the pin seat 154 and supporting the EMI circuitry 152. The EMI circuitry 152 is connected to the power trace 116 by pins 158 (shown in FIG. 3) of the pin seat 154. It is contemplated that the EMI circuitry 152 include one or more of an EMI protection circuit element, a filter, and a transformer. An EMI gasket 176 is arranged between the daughterboard 156 and the enclosure 110. This allows for grounding the EMI circuitry 152 to a ground strap 178 located on the generic motherboard 108 that is electrically isolated from the ground referenced by the other sections of the modular controller 100.

The logic section 122 includes logic circuitry 160, a pin seat 162 supported by the generic motherboard 108 and connected to the signal trace 114 (shown in FIG. 3) and the power trace 116 (shown in FIG. 3), a daughterboard 164 seated in the pin seat 162 and supporting the logic circuitry 160. The logic circuitry 160 is connected to the signal trace 114 by pins 166 (shown in FIG. 3) of the pin seat 162. It is contemplated that the logic circuitry 160 include one or more of a field programmable gate array (FPGA) device, a processor device, and an application-specific integrated circuit (ASIC) device. As will be appreciated by those of skill in the art in view of the present disclosure, the pin seat 162 and the daughterboard 164 abstract the control logic of the logic circuitry 160, which is peculiar to the controlled electrical device, from the generic motherboard 108. This allows the generic motherboard 108 to be generic, i.e., to be common to electrical devices having different logic requirements.

The control section 124 includes power switching circuitry 168, a pin seat 170 seat supported by the generic motherboard 108 and connected to the signal trace 114 (shown in FIG. 3) and the power trace 116 (shown in FIG. 3), and a daughterboard 172 seated in the pin seat 170 and supporting the power switching circuitry 168. The power switching circuitry 168 is connected to the signal trace 114 and the power trace 116 by pins 174 (shown in FIG. 3) of the pin seat 170. It is contemplated that the power switching circuitry 168 include a solid-state switch device and a pulse width modulator operatively associated with the solid-state switch device. As will be appreciated by those of skill in the art in view of the present disclosure, the pin seat 170 and the daughterboard 172 abstract the power switching devices of the power switching circuitry 168 of the modular controller 100, which may be peculiar to the controlled electrical device, from the generic motherboard 108. This allows the generic motherboard 108 to be generic, i.e., to be common to electrical devices having different power switching requirements.

Figure 3:
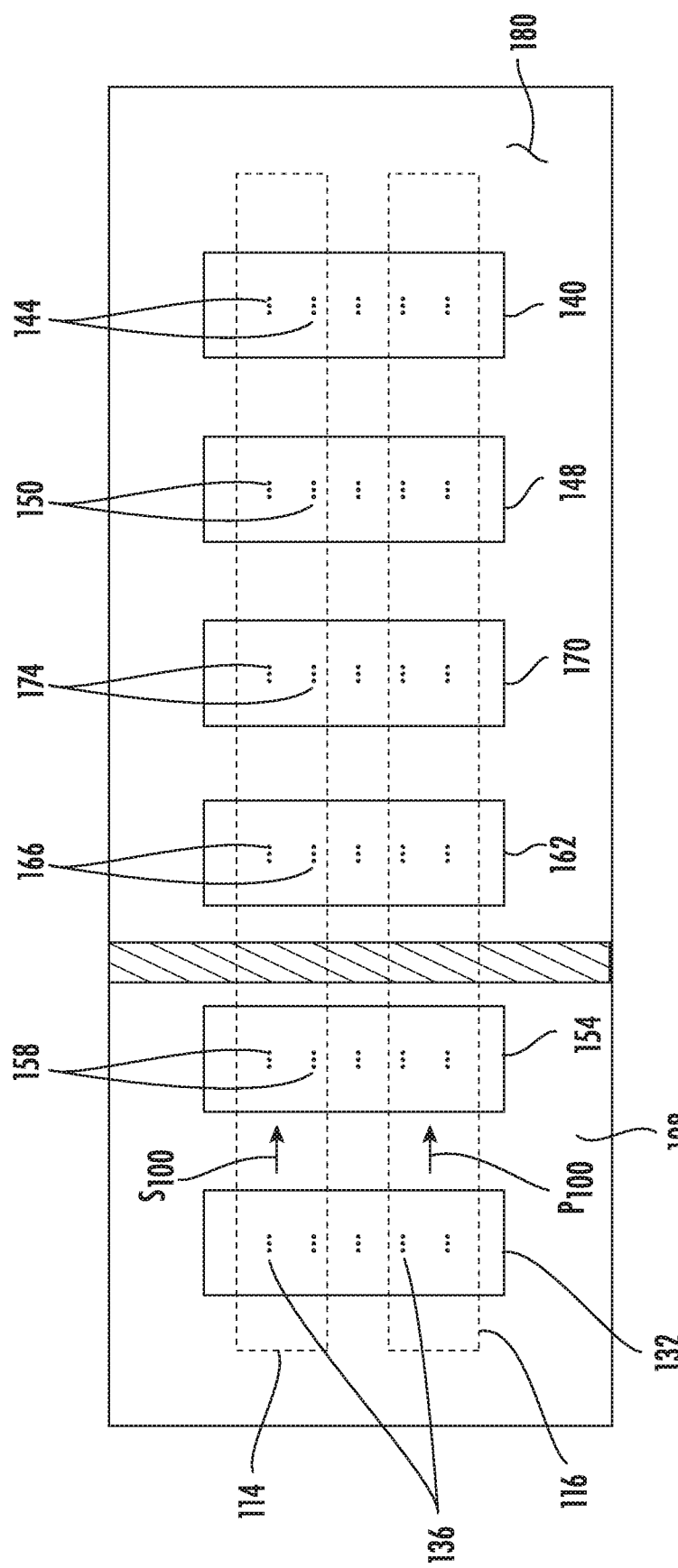
FIG. 3 is a plan view of a motherboard of the modular controller illustrated in FIG. 1, showing a ground strap, pins of the motherboard pin seats, and signal and power traces of the controller motherboard.

With reference to FIG. 3, the generic motherboard 108 is shown. The generic motherboard 108 includes a printed circuit board (PCB) body 180, the signal trace 114, and the power trace 116. The generic motherboard 108 also includes the input power pin seat 132, the output power pin seat 140, and the signal pin seat 48. The generic motherboard 108 additionally includes the EMI section pin seat 154, the switching section pin seat 162, and the control pin seat 170.

The PCB body 180 includes within its interior the signal trace 114 and the power trace 116, and has embedded on its exterior surface the ground strap 178. The power trace 116 and the signal trace 114 are each electrically connected to selected pins of the motherboard pin seats. In this respect each of the pin seats of the generic motherboard 108 has a common number of pins, e.g., fifteen (15) pins, each of which are in electrical communication with one of the signal trace 114 and the power trace 116. This allows the customization of the modular controller 100 (shown in FIG. 1) to be abstracted to the sections, e.g., the sections 118-126, while the generic motherboard 108 be generic irrespective of the sections selected to support the electrical device connected to the modular controller 100. It is to be understood and appreciated that the specific number and arrangement of pins in the pin seats illustrated in FIG. 3 is for illustration purposes only and is non-limiting, and that the pin seats of the generic motherboard 108 can have fewer than fifteen (15) pins or more than fifteen (15) pins, as suitable for an intended application, e.g., for a contemplated family of controllers and electrical devices.

Figure 4:
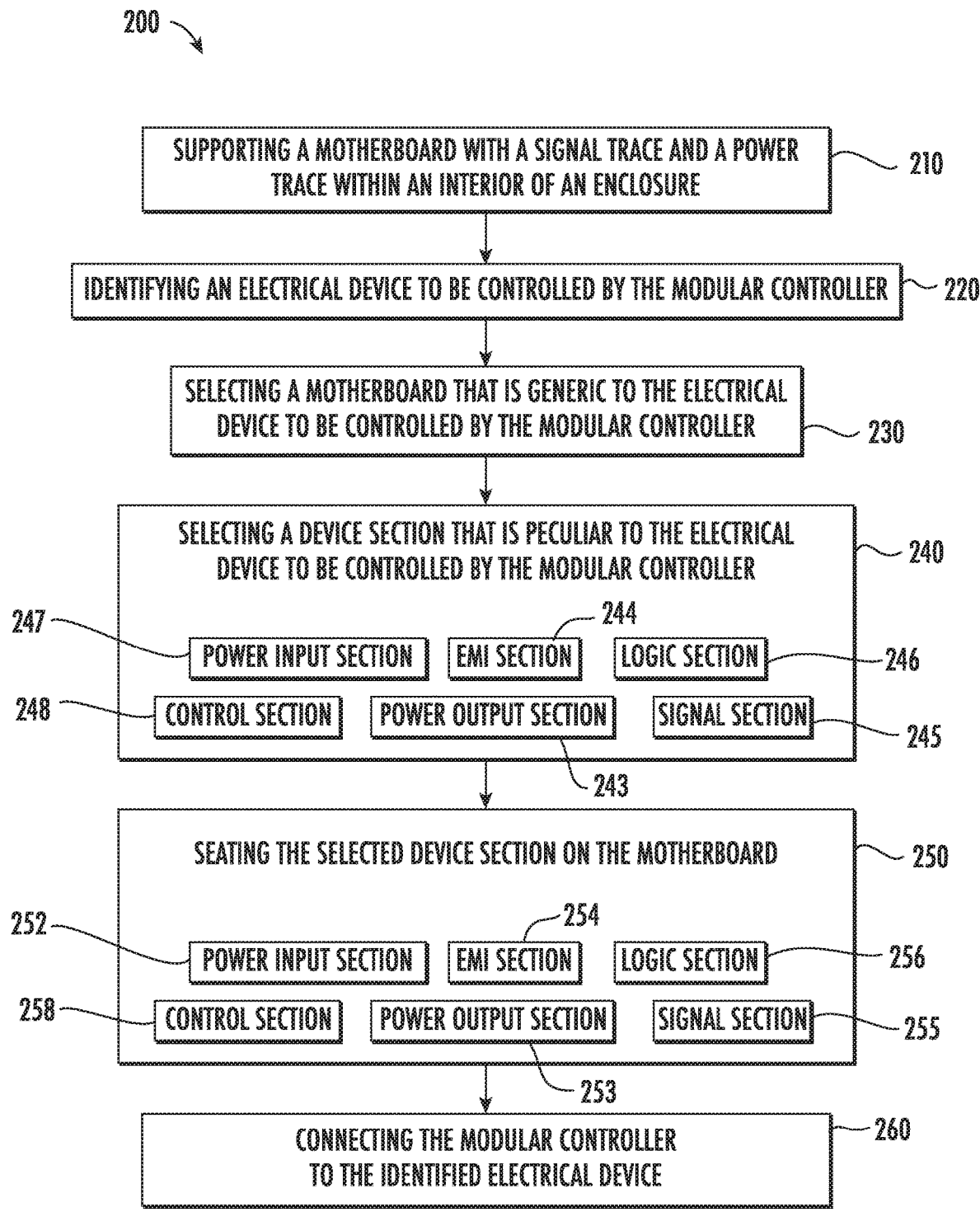
FIG. 4 is a block diagram of a method of configuring a modular controller, showing steps of the method.

With reference to FIG. 4, a method 200 of configuring (or making) a modular controller is shown. Method 200 includes supporting a motherboard with a signal trace and a power trace within an interior of an enclosure, e.g., the generic motherboard 108 (shown in FIG. 1) with the signal trace 114 (shown in FIG. 3) and the power trace 116 (shown in FIG. 3) within the enclosure 110 (shown in FIG. 1), as shown with box 210. An electrical device to be controlled by the electrical device is selected, e.g., the first electrical device 14 (shown in FIG. 1) or the second electrical device 16 (shown in FIG. 1), as shown with box 220. It is contemplated that the selected electrical device be selected from a group of electrical devices having peculiar logic and/or power requirements relative to one another. It is also contemplated that the motherboard selected be generic to the identified electrical device, as shown with box 230.

A device section, e.g., the device section 104 (shown in FIG. 1) or the device section 106 (shown in FIG. 1), is selected that that is peculiar to the electrical device to be controlled by the modular controller, as shown with box 240. It is contemplated that the selected device section include one or more of a input power section, e.g., the input power section 118 (shown in FIG. 2), a output power section, e.g., the output power section 126 (shown in FIG. 2), and a signal section, e.g., the signal section 128 (shown in FIG. 3), as shown with boxes 242, 243 and 245, respectively. It is also contemplated that the selected device section can include one or more of an EMI section, e.g., the EMI section 120 (shown in FIG. 2), a logic section, e.g., the logic section 122 (shown in FIG. 2), and a control section, e.g., the control section 124 (shown in FIG. 2), as shown with box 244, 246 and 248, respectively. The selected device section(s) are then seated on the motherboard, as shown with box 250, i.e., by seating the one or more of the input power section, EMI section, logic section, control section, output power section, and signal section, to the motherboard, as shown by boxes 252-258. The modular controller is then connected to the selected electrical device, which can be a motor for connection to an aircraft electrical system, as shown with box 260.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A modular controller, comprising:
an enclosure having an interior;
a motherboard with a signal trace and a power trace supported within the interior of the enclosure; and
device sections, including:
(a) an input power section, including: an input power connector seated in the enclosure; an input power section pin seat, of a plurality of pin seats having a common number of pins, wherein each of the plurality of pin seats is supported by the motherboard and connected to the signal trace and the power trace; and an input power cable connecting the input power connector to pins of the pin seat;
(b) an electromagnetic interference (EMI) section, including: EMI circuitry; and an EMI section pin seat of the plurality of pin seats;
(c) a logic section, including: logic circuitry, and a logic section pin seat of the plurality of pin seats;
(d) a control section, including: power switching circuitry, and a control section pin seat of the plurality of pin seats;
(e) an ouput power section, including: an output power connector seated in the enclosure; an output power pin seat of the plurality of pin seats; and an output power cable connecting the output power connector to pins of the pin seat; and
(f) a signal section, including: a signal connector seated in the enclosure; a signal section pin seat of the plurality of pin seats; and a signal cable connecting the signal connector to pins of the pin seat;

the device sections being supported by the motherboard to selectively flow electrical power through the power trace using a control signal carried by the signal trace; and wherein: each of the plurality of pin seats is arranged to receive a respective one of a plurality of daughterboards.

2. The modular controller as recited in claim 1, wherein the EMI section comprises:

EMI circuitry comprising one or more of (a) an EMI protection circuit element, (b) a filter, and (c) a transformer;

the EMI section pin seat supported by the motherboard and connected to the signal trace and the power trace; and the EMI section daughterboard seated in the EMI section pin seat and supporting the EMI circuitry, wherein the EMI circuitry is connected to the power trace by pins of the EMI section pin seat.

3. The modular controller as recited in claim 2, further comprising an EMI gasket separating the EMI section daughterboard from the enclosure.

4. The modular controller as recited in claim 2, wherein the motherboard comprises a chassis ground strap, the chassis ground strap electrically connected to the EMI section daughterboard.

5. The modular controller as recited in claim 1, wherein the logic section comprises:

logic circuitry comprising one or more of (a) a field programmable gate array (FPGA) device, (b) a processor device, and (c) an application-specific integrated circuit (ASIC) device;

the logic section pin seat supported by the motherboard and connected to the signal trace and the power trace; and the logic section daughterboard seated in the logic section pin seat and supporting the logic circuitry, wherein the logic circuitry is connected to the signal trace by pins of the logic section pin seat.

6. The modular controller as recited in claim 1, wherein the control section comprises:

power switching circuitry comprising a solid-state switch device and a pulse width modular operatively connected to the solid-state switch device, a pin seat supported by the motherboard and connected to the signal trace and the power trace; and a daughterboard seated in the pin seat and supporting the power switching circuitry, wherein the power switching circuitry is connected to the signal trace by pins of the pin seat, wherein the power switching circuitry is connected to the power trace by pins of the pin seat.

7. The modular controller as recited in claim 1, wherein the device section is peculiar to an electrical device operatively associated with the modular controller.

8. An electrical system, comprising:

a modular controller as recited in claim 1; and a power source connected to a motor device by the modular controller, wherein the motherboard is generic, and wherein the device section is peculiar to the motor device and is operatively associated with the motor device.

9. An aircraft with an electrical system having a modular controller as recited in claim 1.

* * * * *